United States Patent
Gottesman et al.

(10) Patent No.: US 7,256,384 B2
(45) Date of Patent: Aug. 14, 2007

(54) SIGNAL-ENHANCEMENT SYSTEM FOR PHOTODETECTOR OUTPUTS

(76) Inventors: Tal Gottesman, 326 Brockway Ave., Morgantown, WV (US) 26501; Bernard J. Mcgee, 73 Lynwood Ave., Wheeling, WV (US) 26003; Vikram A. Bose-Mullick, 630 Brandon St., Apt. #1, Morgantown, WV (US) 26501

( * ) Notice: Subject to any disclaimer, the term of this patent is extended or adjusted under 35 U.S.C. 154(b) by 0 days.

(21) Appl. No.: 11/255,875

(22) Filed: Oct. 24, 2005

(65) Prior Publication Data
US 2006/0086891 A1    Apr. 27, 2006

Related U.S. Application Data

(60) Provisional application No. 60/620,665, filed on Oct. 22, 2004.

(51) Int. Cl.
  *G01J 1/144* (2006.01)
  *H03G 3/20* (2006.01)
  *H04N 5/217* (2006.01)

(52) U.S. Cl. .................... 250/214 C; 250/214 AG; 348/241

(58) Field of Classification Search ............ 250/214 A, 250/214 AG, 214 C; 348/241
See application file for complete search history.

(56) References Cited

U.S. PATENT DOCUMENTS

| | | | |
|---|---|---|---|
| 4,737,627 A * | 4/1988 | Hughes et al. .......... | 250/223 R |
| 4,868,893 A * | 9/1989 | Hammond ................ | 398/107 |
| 5,491,725 A * | 2/1996 | White ....................... | 375/324 |
| 5,861,754 A * | 1/1999 | Ueno et al. ............... | 324/660 |
| 6,282,218 B1 * | 8/2001 | Anderson ............... | 372/38.02 |
| 6,590,400 B2 * | 7/2003 | Hilliard et al. ......... | 324/654 |
| 6,753,913 B1 * | 6/2004 | Bilhan et al. ............ | 348/241 |
| 2002/0101250 A1 * | 8/2002 | Carsella et al. ......... | 324/642 |

* cited by examiner

*Primary Examiner*—Thanh X. Luu
*Assistant Examiner*—Brian Livedalen
(74) *Attorney, Agent, or Firm*—Connolly Bove Lodge & Hutz LLP

(57) ABSTRACT

A light scattering photometer signal-enhancement systems includes an adaptive sample and subtract circuit controlled by a computer or microcontroller (MCU). The MCU controls the gain of a programmable-gain amplifier (PGA) cascade that is used to amplify the raw photometer signal. In order to maintain the DC accuracy, the DC offset contained in the raw signal from the photometer is estimated by an algorithmic within the MCU and then subtracted from the raw signal before allowing it to be amplified by the PGA cascade. In addition to DC estimation and adaptive cancellation, the MCU applies a digital filtering scheme to compensate irrelevant frequency bands in the amplified signal and offers user determined averaging functions for additional signal conditioning. Moreover, hardware filters are used to prevent signal aliasing by the analog to digital converters (ADC) and a 60 Hz notch filter suppresses general electrical noise.

30 Claims, 2 Drawing Sheets

Functional System Flow Chart

Figure 1: Functional System Flow Chart

SIGNAL-ENHANCEMENT SYSTEM FOR PHOTODETECTOR OUTPUTS

CROSS REFERENCE TO RELATED APPLICATION

The present application claimed priority to U.S. Provisional Application No. 60/620,665 filed on Oct. 22, 2004, the content of which is incorporated herein in its entirety.

BACKGROUND OF THE INVENTION

The field of the invention is signal enhancement of photo detector outputs as seen, for example, in aerosol particle detection and measurement systems. In particular, the present invention is related to enhancement of electrical signals for the detection of light detected by a photodiode and more specifically by light detected by a photodiode as the result of light scattering from a concentration of aerosol particles.

Examples of systems in the background art that use photodetectors include, but are not limited to, optical character recognition systems, communication systems medical imaging sensors, laser range finders, radiation detectors, smoke detectors, position sensors and proximity sensors. In all of these background art systems, a photodetector is used to measure light or radiation in terms of an electrical signal that is processed in various ways to produce a useful information output. In a particular example from the background art, a beam of collimated light, which may or may not be coherent, is directed through a transparent cell in which particles suspended in fluid mixtures are made to pass. Photodetectors are then used to detect the relative amount of light that is scattered or blocked by the particles. The signals generated by the photodetector contain information about the concentration of particles, size of particles, and/or presence of particles.

The type of photodetector used depends on the sensitivity requirements of the device. A photo-multiplier tube is the most sensitive (and costly) method that is currently available. A photo-multiplier can detect the presence of a single photon with nanosecond resolution. However, photo-multiplier tubes are very costly to manufacture and are easily damaged. Additionally they have very high voltage requirements and therefore tend to be used in laboratories rather than in commercial applications.

One alternative to using a photo-multiplier tube is to use a photodiode and a transimpedance amplifier. In contrast to a photo-multiplier, photodiodes are inexpensive, rugged, small, and operate at low voltages.

Another background art device that is used to measure aerosol particle size and concentration is called a light scattering photometer or nephelometer. Applications that require particularly sensitive measurements require photo-multiplier-based photometers.

When the sensitivity requirements of the application do not justify the use of a photo-multiplier tube, a photodiode-based device is preferred due to the reduced cost. However, background art photodiodes are not as sensitive as photo-multiplier tubes and are prone to noise problems associated with electrical amplification.

The sensitivity of a photodiode device is in part a function of the gain of a transimpedance amplifier associated with the photodiode device. The amplified signals contain useful information pertaining to the amount of light reaching the photo detector. However, due to the inherent properties of the photo detector and amplifier circuits, the amplified signal also contains additional factors such as offset voltage potential, noise generated by ambient light and electromagnetic interference. These additional factors have the effect of limiting the possible gain of the amplifier stages before reaching saturation. Therefore, there is a need in the art for a low-cost photodiode-based detector with improved gain and sensitivity.

SUMMARY OF THE INVENTION

The present invention is an apparatus and method for amplification, filtering, DC cancellation, and signal processing of photodetector output signals in order to extract useful information related to the amount of light reaching the detector. Examples of photodetectors include, but are not limited to, photodiodes, phototransistors, photomultiplier tubes and Charge Coupled Device (CCD) image sensors. The present invention also provides a means for outputting the useful information extracted from the photodetectors via at least one of a serial link, visual display, analog output, radio link, or audio output.

In the present invention, the gain and sensitivity of a photodiode-based detector is increased by at least removing the noise and DC offset. This increased sensitivity allows the photodiode-based detector of the present invention to be used in applications that currently require a photo-multiplier-based photometer.

One embodiment of the present invention is an apparatus for enhancing electronic signals from a photodetector comprising: an amplifier; a clamp circuit connected to the amplifier; a programmable gain amplifier connected to the clamp circuit; filter connected to the programmable gain amplifier; a notch filter connected to the filter; an analog-to-digital converter connected to the notch filter; at least one digital-to-analog converter connected to the analog-to-digital converter; an inverting-summing amplifier; an input of the amplifier; at least one DC reference generator; and a computer, wherein the computer is connected to the analog-to-digital converter, the programmable gain amplifier, the filter, the notch filter and the at least one digital-to-analog converter and provides feedback control and digital filtering for the apparatus.

Another embodiment of the present invention is a method for enhancing electronic signals from a photodetector comprising: at least one of starting and resetting the photodetector; initializing digital-to-analog converters (DACs), analog-to-digital converters (ADCs) programmable gain amplifiers (PGAs) and filter parameters; subtracting a voltage increment from the output of a filter until the output of the filter is at least one of less than and equal to a predetermined coarse threshold voltage; subtracting a voltage increment from the output of the filter until the output of the filter is at least one of less than and equal to a predetermined fine threshold voltage; filtering and signal processing the output of the filter; and outputting the filtered and signal processed output of the filter until receiving at least one of a power down and reset command.

BRIEF DESCRIPTION OF THE DRAWINGS

The invention can be described in greater detail with the aid of the following drawings.

DETAILED DESCRIPTION OF THE PREFERRED EMBODIMENT

Figure 1:
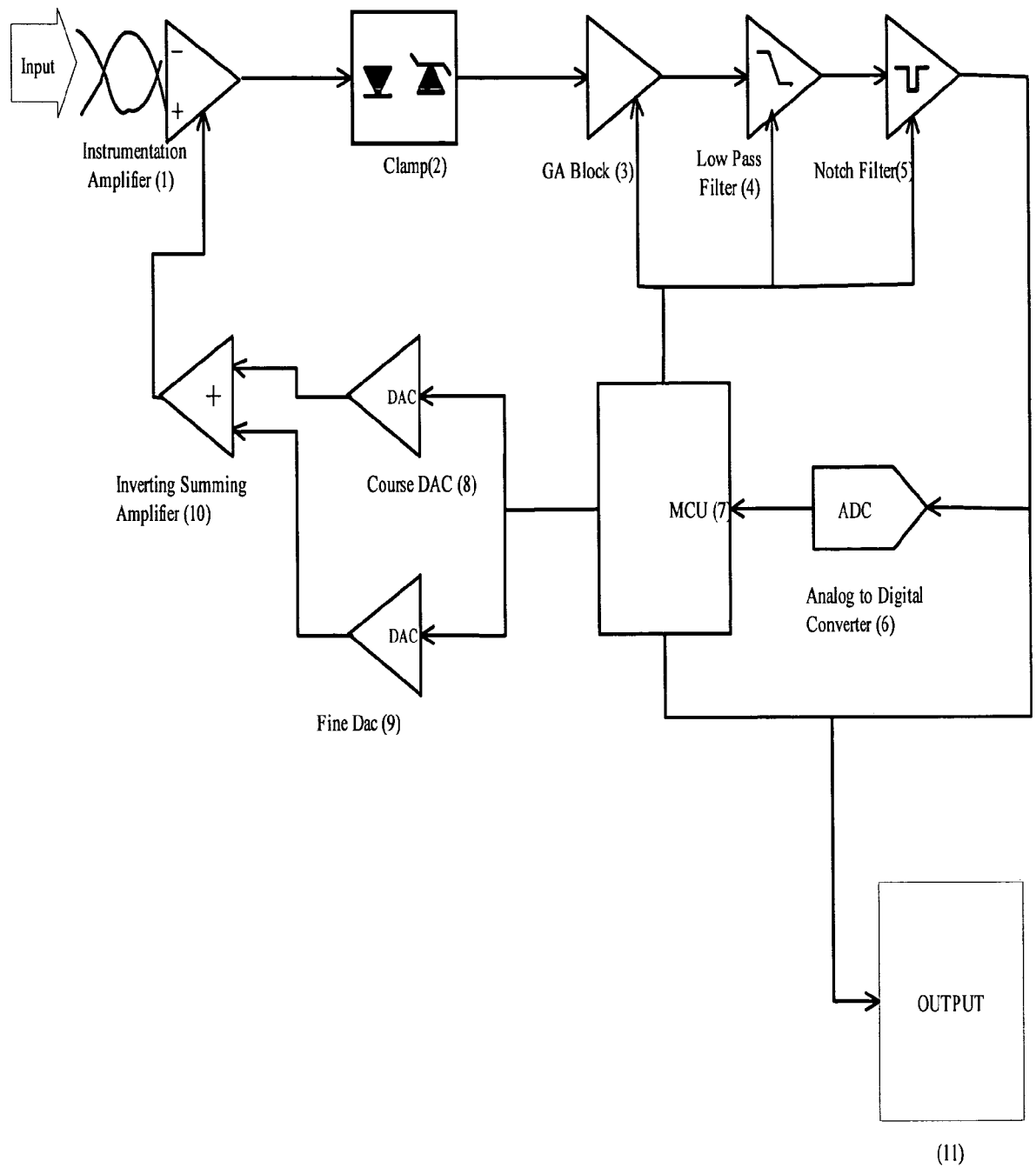
FIG. 1. is an exemplary block diagram showing the functional blocks used to implement the apparatus and method of the present invention.

The exemplary system block diagram of FIG. 1 shows the apparatus of the present invention. In particular, FIG. 1 shows an example of the functions of amplification, filtering, DC-cancellation, and signal processing of a photometer device. The analog signal from the photometer is input into the apparatus via a twisted pair cable connected to the non-inverting input of an instrumentation amplifier 1. The amplifier 1 can be any type of instrumentation amplifier and should be selected with a high common mode rejection ratio (CMRR) as the major deciding factor. The amplifier 1 should ideally have a CMRR of at least 85 dB. This amplifier 1 in the system can also provide a small gain to the signal (i.e., between 1 and 10). The output of the instrumentation amplifier 1 may then pass through a voltage clamp 2 to protect the rest of the system from over-voltage or under-voltage signals.

After passing through the voltage clamp 2, the analog signal passes through at least one programmable gain amplifier (PGA) 3 that further amplifies the signal. The exact gain of the PGA 3 is controlled by the microcontroller (MCU) 7, and can be programmed to suit the specific application. In addition, the gain may be static or a function of a control algorithm.

The signal is then filtered with a low pass filter 4 with a cutoff frequency that may be fixed or controlled by the MCU 7. The low pass filter 4 may be passive or active and may be activated or deactivated by the MCU 7, or bypassed with the use of a jumper. A notch filter 5 is then implemented to remove frequency specific noise in the signal. The stop band of the notch filter 5 has a default frequency of 60 HZ, and can be shifted by the MCU 7 or with settings determined by jumpers. The notch filter 5 may also be passive or active, and may be bypassed by the MCU 7 or with the use of a jumper. The output of the PGA 3 and filter blocks 4, 5 may be provided as an analog output 11 of the apparatus.

The MCU 7 will receive this filtered signal after the filtered signal passes through an internal or external analog-to-digital converter (ADC) 6. The MCU 7 will also control several digital to analog converters (DACs) 8, 9, which may be internal or external to the MCU 7. The voltage references of the DAC blocks may be set so that each one is lower than a previous voltage reference. This configuration allows for a course adjustment DAC 8, and successively finer adjustments DAC 9.

An inverting summing amplifier 10 is used to sum and invert the outputs of one or more DACs 8, 9. This inverted sum is then input to the instrumentation amplifier 1 to create a negative DC offset for DC signal cancellation.

Optionally, another DAC (not shown) may be included in the output block 11 and would be controlled by the MCU 7. This enables the MCU 7 to implement a multitude of digital filtering techniques and to output the result as an analog voltage. The MCU 7 can also control an internal or external serial port or other device for serial output. Any number of other output devices may be driven by the MCU 7 to provide an audio output, visual display, or radio link output.

In the apparatus discussed above, preferably the photodetector has a maximum sensitivity having an approximate wavelength of between at least one of 100 and 400 nm, 400 and 600 nm, 600 and 700 nm, 700 and 1100 nm for the ultra violet spectrum, blue-green-yellow spectrum, red spectrum, and infrared spectrum, respectively.

Further, in the apparatus discussed above, preferably a signal from the photodetector is amplified via a trans-impedance amplifier to achieve a gain of between at least one of 1 and 30,000; 1 and 10,000,000, wherein the amplifier has a common mode amplification is achieved from an instrumentation amplifier with a high Common Mode Rejection Ratio (CMRR) and a gain of 5.

Further, in the apparatus discussed above, the instrumentation amplifier preferably has at least one of a common mode amplification gain that is variable between at least one of 1 and 100; a common mode amplification gain that is fixed between 1 and 100.

Further, in the apparatus discussed above, the programmable gain amplifier cascade is preferably dynamically controlled by the computer; and the programmable gain amplifier achieves a gain of between at least one of 1 and 30,000; and 1 and 100,000.

Further, the filter preferably provides band compensation; an anti-aliasing signal used for digital processing. In addition, the filter is preferably configured to provide at least one of a Butterworth response, a Bessel response, a Chebychev Response, and an Elliptic response. Moreover, the filter is between 1st and 8th order, at least one of passive and active, at least one of a continuous time filter and a switched capacitor, and implemented as a digital filter.

Further, the notch filter is preferably designed for at least one of a 60 Hz cut-off and a 50 Hz cut-off, at least one of an active filter and a passive filter, and at least on of a continuous time filter, digital filter and a switched capacitor filter.

Further, for the apparatus discussed above, the computer is configured to estimate the DC noise and to utilize a feedback control scheme for canceling the DC noise; measures the amplified signal via an analog-to-digital Converter; measures the amplified signal via a voltage comparator; controls a DC reference generator for subtracting an initial input DC offset voltage using a closed loop feedback scheme; controls at least one of an audio alarm, visual display, machine interlock, and radio transmitter; generates a DC level via Digital-to-Analog Converter for subtracting an input DC offset voltage with a closed loop feedback scheme; generates a DC level via a buffered digital potentiometer for subtracting an input DC offset voltage with a closed loop feedback scheme; generates a DC level via pulse width modulation for subtracting an input DC offset voltage with a closed loop feedback scheme; and provides various digital and analog outputs to control the components that comprise the apparatus.

Moreover, for the apparatus discussed above, the analog output may range between at least one of 0 and 5 volts, 0 and 1 volts, 0 and 10 volts, 0 and 12 volts, 0 and 3.3 volts, and 0 and 24 volts; and the apparatus is powered by a DC source of at least one of 5 Volts, 3.7 Volts, 7.4 Volts, 3.3 Volts, 9 Volts, 12 Volts, 24 Volts, 110 Volts, and 220 Volts.

Figure 2:
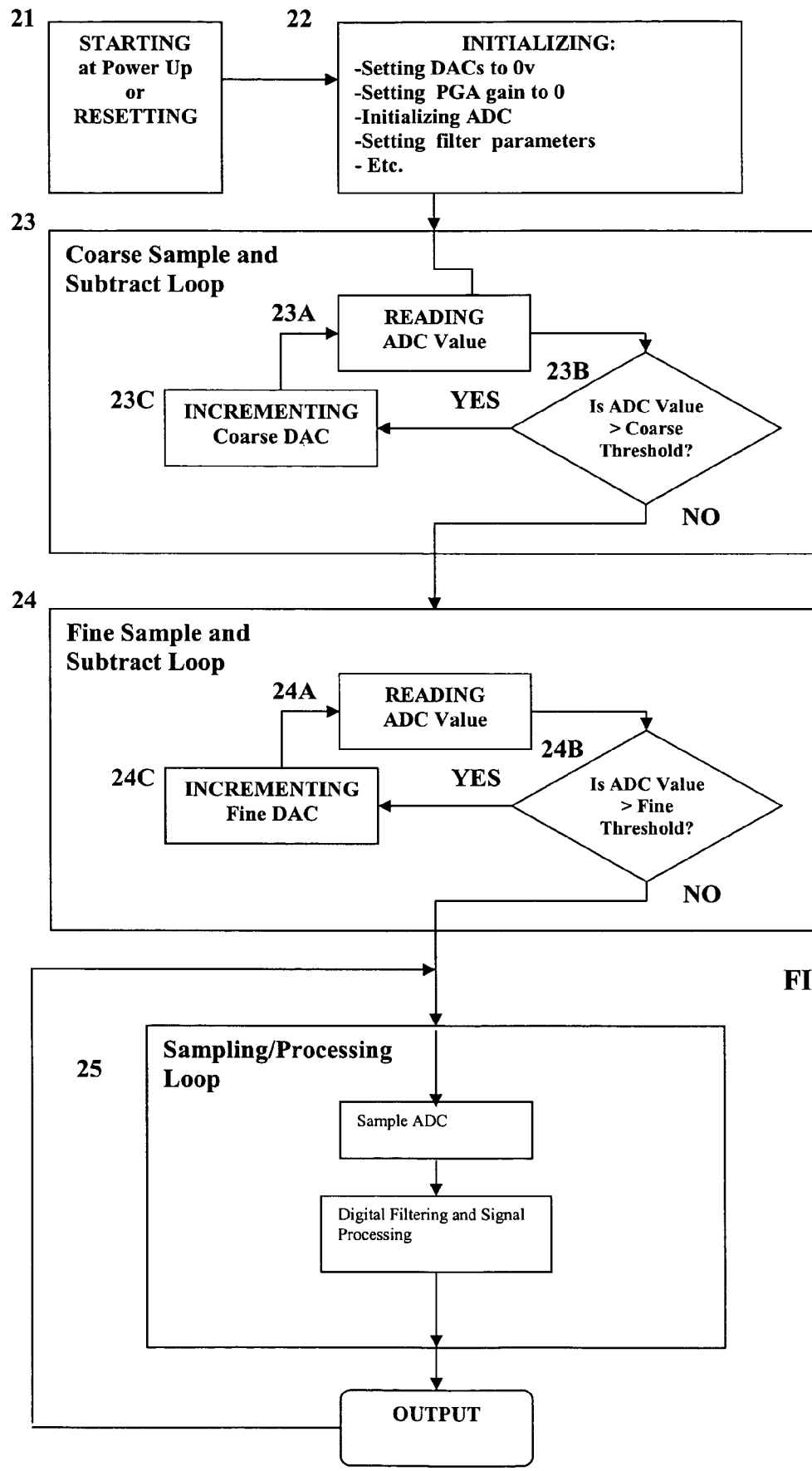
FIG. 2. is an exemplary flowchart showing the photometer signal auto zeroing via an adaptive DC cancellation algorithm.

The flow diagram shown in FIG. 2 illustrates the method by which the MCU controls a system for enhancing electronic signals from a photodetector. Step 21 of FIG. 2 is directed to an initial step of powering or resetting the system. After power-up or when reset, the MCU initializes the hardware of the system, as shown in step 22. In particular, step 22 at least comprises setting the output voltages of the DACs to 0V; setting the PGA gain to zero; initializing the ADCs; and setting the corner frequencies of the filters.

Next, in step 23, the MCU runs the Coarse Sample and Subtract Loop. In particular, in step 23A the MCU reads the voltage level of the output signal of the filter blocks, via the ADC value. Step 23B determines whether the voltage level is above a predetermined coarse threshold voltage level.

If the voltage level of the output signal of the filter blocks is above the predetermined coarse threshold voltage level (i.e., "YES" output for 23B), then a coarse adjustment is made in step 23C where the MCU increments coarse DAC voltage. Step 23C has the effect of subtracting the incremented voltage from the output signal. Steps 23A, 23B and 23C are repeated until the DC component of the input signal has been canceled to within the predetermined coarse threshold voltage level. When the voltage level is within the predetermined coarse threshold voltage level (i.e., "NO" output for 23B), the method continues to the Fine Sample and Subtract Loop 24, as shown in FIG. 2.

In the Fine Sample and Subtract Loop 24 of FIG. 2, the entire process of sampling the filtered output voltage and incrementing a DAC is repeated with the fine DAC adjustment. In particular, in step 24A the MCU reads the voltage level of the output signal of the filter blocks, via the ADC value. Step 24B determines whether the voltage level is above a predetermined fine threshold voltage level.

If the voltage level of the output signal of the filter blocks is above the predetermined fine threshold voltage level (i.e., "YES" output for 24B) then a fine adjustment is made in step 24C, where the MCU increments fine DAC voltage. Step 24C has the effect of subtracting the incremented voltage from the output signal. Steps 24A, 24B and 24C are repeated until the DC component of the input signal has been canceled to within the predetermined fine threshold voltage level. Until the output voltage is less than the predetermined fine threshold voltage. There may be as many successively finer DAC adjustments and threshold voltages as a specific application demands. When the voltage level is within the predetermined fine threshold voltage level (i.e., "NO" output for 24B), the method continues to the Sampling/Processing section 25, as shown in FIG. 2.

Step 25 of FIG. 2 shows the Sampling/Processing Loop 25. After the DC cancellation of step 23 and step 24 is completed, the MCU will continuously sample the filtered signal via the ADC in step 25A. Sampling is performed by the ADC at regular time intervals in accordance with the Nyquist sampling theorem (i.e., at least two (2) times the highest frequency component). The MCU may then implement any number of digital filtering, pattern recognition, or predictive control algorithms in the Digital Filtering and Signal Processing functions of step 25B. Non-limiting examples of such algorithms include Proportional Integral, Least Mean Square or Kalman Filter.

In step 26, the MCU outputs the results via at least one of an output DAC, serial output port, parallel output port, USB output port and Radio Link before continuously repeating the Sampling/Processing Loop 25. The MCU may also control specific output devices such as an audio alarm, visual display, machine interlock, radio transmitter, or any other electrically controlled device. The Sampling/Processing Loop 25 will continue until either the device is powered down or reset by the user or by the MCU in response to a preprogrammed condition.

The foregoing description illustrates and describes the present invention. Additionally, the disclosure shows and describes only the preferred embodiments of the invention, but as mentioned above, it is to be understood that the invention is capable of use in various other combinations, modifications, and environments and is capable of changes or modifications within the scope of the inventive concept as expressed herein, commensurate with the above teachings and/or skill or knowledge of the relevant art. The embodiments described hereinabove are further intended to explain best modes known of practicing the invention and to enable others skilled in the art to utilize the invention in such, or other embodiments and with the various modifications required by the particular applications or uses of the invention. Accordingly, the description is not intended to limit the invention to the form or application disclosed herein. Also, it is intended that the appended claims be construed to include alternative embodiments.

The invention claimed is:

1. An apparatus for enhancing electronic signals from a photodetector comprising:
   an amplifier;
   a clamp circuit connected to the output of the amplifier;
   a programmable gain amplifier connected to the clamp circuit;
   a filter connected to the programmable gain amplifier;
   a notch filter connected to the filter;
   an analog-to-digital converter connected to the notch filter;
   an inverting-summing amplifier connected to the amplifier and configured to provide a negative DC offset and DC signal cancellation to the amplifier;
   a course adjustment digital-to-analog converter connected to an input of the inverting-summing amplifier;
   a fine adjustment digital-to-analog converter connected to another input of the inverting-summing amplifier;
   at least one DC reference generator configured to provide voltage references to the digital-to-analog converters; and
   a computer, wherein the computer provides control signals for and is connected to the analog-to-digital converter, the programmable gain amplifier, the filter, the notch filter, course adjustment digital-to-analog converter and the fine adjustment digital-to-analog converter; and the computer provides feedback control and digital filtering for the apparatus.

2. An apparatus according to claim 1, wherein the photodetector has a maximum sensitivity having an approximate wavelength of between at least one of 100 and 400 nm, 400 and 600 nm, 600 and 700 nm, 700 and 1100 nm for the ultra violet spectrum, blue-green-yellow spectrum, red spectrum, and infrared spectrum, respectively.

3. An apparatus according to claim 1, wherein a signal from the photodetector is amplified via a trans-impedance amplifier to achieve a gain of between at least one of 1 and 30,000; and 1 and 10,000,000.

4. An apparatus according to claim 1, wherein the amplifier has a common mode amplification that is achieved with an instrumentation amplifier with a high Common Mode Rejection Ratio (CMRR) and a gain of 5.

5. An apparatus according to claim 4, wherein the instrumentation amplifier has a common mode amplification gain that is variable between at least one of 1 and 100.

6. An apparatus according to claim 4, wherein the instrumentation amplifier has a common mode amplification gain that is fixed between 1 and 100.

7. An apparatus according to claim 1, wherein the programmable gain amplifier cascade is dynamically controlled by the computer.

8. An apparatus according to claim 1, wherein the programmable gain amplifier achieves a gain of between at least one of 1 and 30,000; and 1 and 100,000.

9. An apparatus according to claim 1, wherein the filter provides band compensation.

10. An apparatus according to claim 1, wherein the filter provides anti-aliasing signal used for digital processing.

11. An apparatus according to claim 1, wherein the filter is configured to provide at least one of a Butterworth response, a Bessel response, a Chebychev Response, and an Elliptic response.

12. An apparatus according to claim 11, wherein the filter is between 1st and 8th order.

13. An apparatus according to claim 12, wherein the filter is at least one of passive and active.

14. An apparatus according to claim 12, wherein the filter is at least one of a continuous time filter and a switched capacitor.

15. An apparatus according to claim 12, wherein the filter is implemented as a digital filter.

16. An apparatus according to claim 1, wherein the notch filter is designed for at least one of a 60 Hz cut-off and a 50 Hz cut-off.

17. An apparatus according to claim 16, wherein the notch filter is at least one of an active filter and a passive filter.

18. An apparatus according to claim 16, wherein the notch filter is a continuous time filter.

19. An apparatus according to claim 16, wherein the notch filter is at least on of a digital filter and a switched capacitor filter.

20. An apparatus according to claim 1, wherein the computer is configured to estimate the DC noise and to utilize a feedback control scheme for canceling the DC noise.

21. An apparatus according to claim 1, wherein the computer measures the amplified signal via the analog-to-digital Converter.

22. An apparatus according to claim 1, wherein the computer measures the amplified signal via a voltage comparator.

23. An apparatus according to claim 1, wherein the computer controls the at least one DC reference generator for subtracting an initial input DC offset voltage using a closed loop feedback scheme.

24. An apparatus according to claim 1, wherein the computer controls at least one of an audio alarm, visual display, machine interlock, and radio transmitter.

25. An apparatus according to claim 1, wherein the computer generates a DC level via the at least one digital-to-analog Converter for subtracting an input DC offset voltage with a closed loop feedback scheme.

26. An apparatus according to claim 1, wherein the computer generates a DC level via a buffered digital potentiometer for subtracting an input DC offset voltage with a closed loop feedback scheme.

27. An apparatus according to claim 1, wherein the computer generates a DC level via pulse width modulation for subtracting an input DC offset voltage with a closed loop feedback scheme.

28. An apparatus according to claim 1, wherein the computer provides digital and analog outputs to control the components that comprise the apparatus.

29. An apparatus according to claim 28, wherein the analog outputs may range between at least one of 0 and 5 volts, 0 and 1 volts, 0 and 10 volts, 0 and 12 volts, 0 and 3.3 volts, and 0 and 24 volts.

30. An apparatus according to claim 1, wherein the device is powered by a DC source of at least one of 5 Volts, 3.7 Volts, 7.4 Volts, 3.3 Volts, 9 Volts, 12 Volts, 24 Volts, 110 Volts, and 220 Volts.

* * * * *